United States Patent [19]
Ahn

[11] Patent Number: 6,011,309
[45] Date of Patent: Jan. 4, 2000

[54] WIRING STRUCTURE OF THIN FILM TRANSISTOR ARRAY AND METHOD OF MANUFACTURING THE SAME

[75] Inventor: Byung-Chul Ahn, Kyungsangbook-do, Rep. of Korea

[73] Assignee: LG Electronics Inc., Seoul, Rep. of Korea

[21] Appl. No.: 08/993,097

[22] Filed: Dec. 18, 1997

[30] Foreign Application Priority Data

Mar. 6, 1997 [KR] Rep. of Korea .......................... 97-7401

[51] Int. Cl.[7] ............................ H01L 23/48; H01L 23/52; H01L 29/40
[52] U.S. Cl. ............................ 257/758; 257/774; 257/776
[58] Field of Search ...................... 257/529, 530, 257/751, 758, 774, 776

[56] References Cited

U.S. PATENT DOCUMENTS

| | | | |
|---|---|---|---|
| 4,265,935 | 5/1981 | Hall . | |
| 5,204,286 | 4/1993 | Doan . | |
| 5,229,645 | 7/1993 | Nakashima | 257/773 |
| 5,442,236 | 8/1995 | Fukazawa | 257/758 |
| 5,512,778 | 4/1996 | Chung et al. | 257/629 |
| 5,684,331 | 11/1997 | Jun | 257/758 |
| 5,691,572 | 11/1997 | Chung | 257/751 |
| 5,739,579 | 4/1998 | Chiang et al. | 257/635 |
| 5,760,429 | 6/1998 | Yano et al. | 257/211 |

FOREIGN PATENT DOCUMENTS 96-24600  7/1996  Rep. of Korea .

*Primary Examiner*—Ngân V. Ngô
*Attorney, Agent, or Firm*—Morgan, Lewis & Bockius LLP

[57] ABSTRACT

The present invention relates to a method for connecting the two conductive lines located on separate layers with an intervening insulation layer between them, and a wiring structure formed by the same method. The method includes the steps of forming a first conductive layer on the substrate, forming an insulation layer on the first conductive layer, forming a second conductive layer having a first portion overlapping the first conductive layer, removing a portion of the first portion of the second conductive layer that overlaps the first conductive layer to form a top contact hole exposing a portion of the insulation layer, removing the exposed portion of the insulation layer through the top contact hole to form an enlarged contact hole, and forming a conductive pad in contact with the first conductive layer and the second conductive layer through the enlarged contact hole.

34 Claims, 10 Drawing Sheets

WIRING STRUCTURE OF THIN FILM TRANSISTOR ARRAY AND METHOD OF MANUFACTURING THE SAME

This application claims the benefit of Korean patent application No. P97-7401, filed Mar. 6, 1997, which is hereby incorporated by reference.

BACKGROUND OF THE INVENTION

1. Field of the Invention

The present invention relates to a method for connecting conductive lines formed on separate layers with an intervening insulation layer, More particularly, the present invention relates to a method of manufacturing a semiconductor device having a plurality of thin film transistors, such as memories and liquid crystal display devices, and a wiring structure on different layers.

2. Description of the Related Art

The number of thin film transistors (TFTs) integrated in a unit area is a very important parameter in manufacturing a high density and micro-sized semiconductor device or a high resolution liquid crystal display (LCD) device, In order to design a high-capacity memory device or an LCD device with higher resolution than XGA (Extended Video Graphic Array), the number of TFTs per unit area must be increased. Therefore, bus lines connected to the TFTs are squeezed into ever narrower areas. Therefore, the area used to connect the gate line of the TFT to another line must decrease as well.

A conventional method for connecting bus lines formed on separate layers, and a wiring structure formed by the same method, is as follows. FIG. 1a shows the cross-sectional view of the bus lines formed in separate layers using a conventional method. FIG. 1b shows a plan view of the wiring structure formed using the conventional method. FIGS. 2a–2d show the manufacturing process of the same.

A metal layer, such as aluminum or an aluminum alloy, is deposited on a substrate 11. The metal layer is patterned to form a low resistance gate line 15a. The surface of the low resistance gate line 15a can generate a hillock. A metal layer including chromium or molybdenum is deposited on the substrate 11. The metal layer is patterned to form a second-metal gate line 15 covering the low resistance gate line 15a, as shown in FIG. 2a. The second-metal gate line 15 prevents formation of a hillock on the low resistance gate line 15a.

An insulation material, such as silicon oxide or silicon nitride, is deposited on the substrate 11 having the second-metal gate line 15 to form a gate insulation layer 19. A metal layer, such as chromium or a chromium alloy, is deposited on the gate insulation layer 19, as shown in FIG. 2b. The metal layer is patterned to form a source line 35. The source line 35 is connected to a source electrode of a switching element, such as a TFT.

An insulation material, such as silicon nitride or silicon oxide, is deposited on the substrate 11 having the source line 35 to form a protection layer 39. As shown in FIG. 2b, the low resistance gate line 15a and the second-metal gate line 15, and the source line 35 are located on separate layers, with the gate insulation layer 19 positioned between them. The second-metal gate line 15 and the source line 35 should not normally be connected to each other, because they are used for different purposes. However, they need to be connected to each other during some processing steps, in order to protect the substrate from static electricity damage. For example, if a repair line for source line 35 is formed on the same layer of the same material as the second-metal gate line 15, then the source line 35 should be connected to the repair line. In order to connect the source line 35 to the second-metal gate line 15 (or to the repair line on the same layer as the second-metal gate line 15), a gate contact hole 41 and a source contact hole 51 are first formed, as shown in FIG. 2c. The gate contact hole 41 exposes a portion of the second-metal gate line 15 by etching the protection layer 39 and the gate insulation layer 19. The source contact hole 51 exposes a portion of the source line 35 by etching the protection layer 39 covering the source line 35.

A layer of conductive material, such as indium tin oxide (ITO), is deposited on the protection layer 39. The ITO layer is patterned to form a connecting pad 53. The connecting pad 53 connects the second-metal gate line 15 and the source line 35 through the gate contact hole 41 and the source contact hole 51, as shown in FIG. 2d.

In the conventional method for connecting bus lines formed on separate layers, the lines are connected by a third conductive material through the contact holes formed in same plane. Therefore, space for the contact holes must be reserved. Therefore, there is a limitation to manufacturing a higher density semiconductor device using the conventional method. When manufacturing a high density semiconductor device, all building components of the device become smaller and smaller. Thus, the gate lines and the source lines become narrower and narrower. Furthermore, as the number of connecting parts increases, the area needed for connecting hinders higher integration.

SUMMARY OF THE INVENTION

Accordingly, the present invention is directed to a wiring structure of a thin film transistor array and method of manufacturing the same that substantially obviates one or more of the problems due to the limitations and disadvantages of the related art.

An object of the present invention is to reduce the amount of area needed for connection lines in manufacturing the electrical circuit board, including multiple layers of bus lines.

Another object of the present invention is to simplify the process for connecting metal lines formed on separate layers.

Additional features and advantages of the present invention will be set forth in the description which follows, and will be apparent from the description, or may be learned by practice of the invention. The objectives and other advantages of the invention will be realized and attained by the structure and process particularly pointed out in the written description as well as in the appended claims.

To achieve these and other advantages and according to the purpose of the present invention, as embodied and broadly described, in a first aspect of the present invention there is provided a method for fabricating a semiconductor device on a substrate including the steps of forming a first conductive layer on the substrate, forming an insulation layer on the first conductive layer, forming a second conductive layer having a first portion overlapping the first conductive layer, removing a portion of the first portion of the second conductive layer that overlaps the first conductive layer to form a top contact hole exposing a portion of the insulation layer, removing the exposed portion of the insulation layer through the top contact hole to form an enlarged contact hole, and forming a conductive pad in contact with the first conductive layer and the second conductive layer through the enlarged contact hole.

In a second aspect of the present invention there is provided a method for fabricating a semiconductor device on a substrate including the steps of forming a first conductive layer on the substrate, forming a first insulation layer on the first conductive layer, forming a second conductive layer having a first portion overlapping the first conductive layer, forming a second insulation layer on the second conductive layer, removing selected portions of the second insulation layer, the second conductive layer and the first insulation layer to form a contact hole at a position corresponding to the first portion of the second conductive layer, and forming a conductive pad in contact with the first conductive layer and the second conductive layer through the contact hole.

In a third aspect of the present invention there is provided a semiconductor device, including a substrate, a first conductive layer on the substrate, an insulation layer covering the first conductive layer and having a first contact hole exposing a portion of the first conductive layer, a second conductive layer having an overlapping portion overlapping the first conductive layer, the overlapping portion having a second contact hole exposing the portion of the first conductive layer that is exposed through the first contact hole, and a conductive pad, over the second conductive layer, the conductive pad connecting the first conductive layer with the second conductive layer through the first and the second contact holes.

In a fourth aspect of the present invention there is provided a semiconductor device including a substrate, a first conductive layer on the substrate, a first insulation layer covering the first conductive layer and having a first contact hole exposing a portion of the first conductive layer, a second conductive layer having an overlapping portion overlapping the first conductive layer, the overlapping portion having a second contact hole exposing the exposed portion of the first conductive layer, a second insulation layer covering the second conductive layer and the first insulation layer, the second insulation layer having a third contact hole exposing the exposed portion of the first conductive layer, and a conductive pad over the second insulation layer, the conductive pad connecting the first conductive layer with the second conductive layer through the first, second, and third contact holes.

In a fifth aspect of the present invention there is provided a method of fabricating a semiconductor device, including the steps of forming a first conductive line on a substrate, forming an insulation layer over the first conductive line and the substrate, forming a second conductive line on the insulation layer, wherein a portion of the second conductive line partly overlaps a portion of the first conductive line, forming a source contact hole in the second conductive line and over the portion of the first conductive line, etching the insulation layer by using the second conductive line as a mask, and forming a connecting pad connecting the second conductive line and the first conductive line.

In a sixth aspect of the present invention there is provided a method of fabricating a semiconductor device including the steps of forming a first conductive line on a substrate, forming a insulation layer over the first conductive line and the substrate, forming a second conductive line on the insulation layer, wherein a portion of the second conductive line partly overlaps a portion of the first conductive line, forming a source contact hole in the second conductive line and over the portion of the first conductive line, forming a protection layer over the substrate, the first conductive line, the insulation layer, and the second conductive line, removing a portion of the protection layer over the source contact hole to form a top contact hole, forming a gate contact hole in the insulation layer, and forming a connecting pad connecting the second conductive line and the first conductive line.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention, and are incorporated in and constitute a part of this specification, illustrate embodiments of the invention that together with the description serve to explain the principles of the invention, In the drawings:

FIG. 5b shows a plan view of the structure of FIG. 5a;

FIGS. 6a–6d are cross-sectional views showing a manufacturing process for the structure of FIG. 5a;

FIG. 7b shows a plan view of the structure of FIG. 7a;

DETAILED DESCRIPTION OF THE PREFERRED EMBODIMENTS

Reference will now be made in detail to the preferred embodiments of the present invention, examples of which are illustrated in the accompanying drawings.

The present invention provides a method for connecting conductive bus lines using one contact hole formed at the connecting portion of two connected lines. The present invention also provides a simplified method for connecting bus lines using one contact hole in one photolithographic step. Furthermore, the present invention provides a wiring structure having a connecting part using narrower area.

The manufacturing method of present invention includes a step of forming a first conductive line on a substrate; forming an insulation layer covering the first conductive line; forming a second conductive line on which some portion is overlapping the some portion of the first conductive line; and forming a contact hole by etching the overlapped portion of the second conductive line. After that, the exposed portion of the insulation layer through the contact hole is continuously etched and the overlapping portion of the first conductive layer is exposed through the contact hole. The present invention further includes a step of forming contact terminal connected to the first conductive line and the second conductive line through the contact hole.

The present invention relates to a method for connecting conductive lines formed on separate layers and having an intervening insulation layer between them, and a wiring structure formed by the same method. In the present invention, a first line is located on a first layer. An intervening layer is placed over the first line. A second line is located on the intervening layer in such a way as to overlap the first layer. A contact hole is formed at the overlapping portion of the first line and the second line. The second line has a contact hole exposing the first line is exposed. Using a conductive material, the first line and the second line are connected through the contact hole. Therefore, the contacting area of the present invention is smaller than that of conventional art. Furthermore, there is no problem with cutting the connecting pad. Thus, connecting error is reduced, and the manufacturing yield is increased for semiconductor devices or LCD displays having many lines and many layers.

First Preferred Embodiment

Figure 1A:
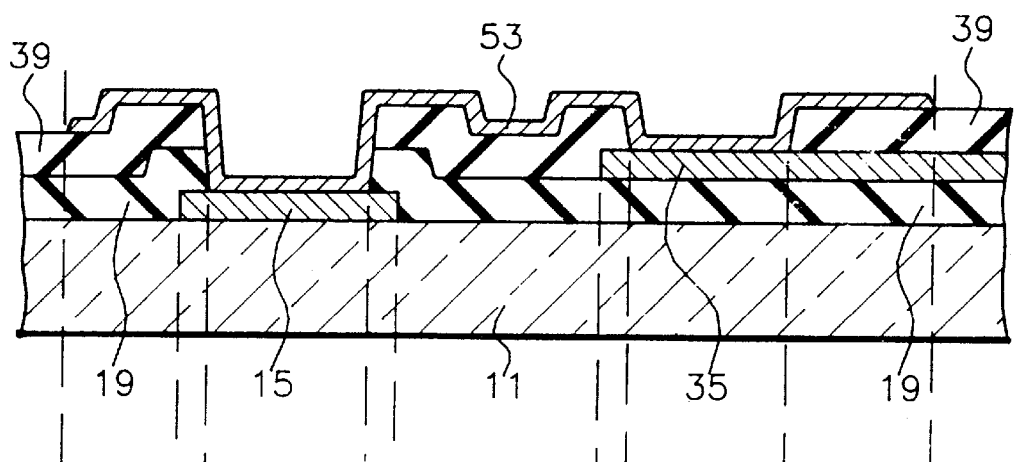
FIG. 1a shows a cross-sectional view of a conventional structure of connecting the two lines formed on separate layers.
Figure 1B:
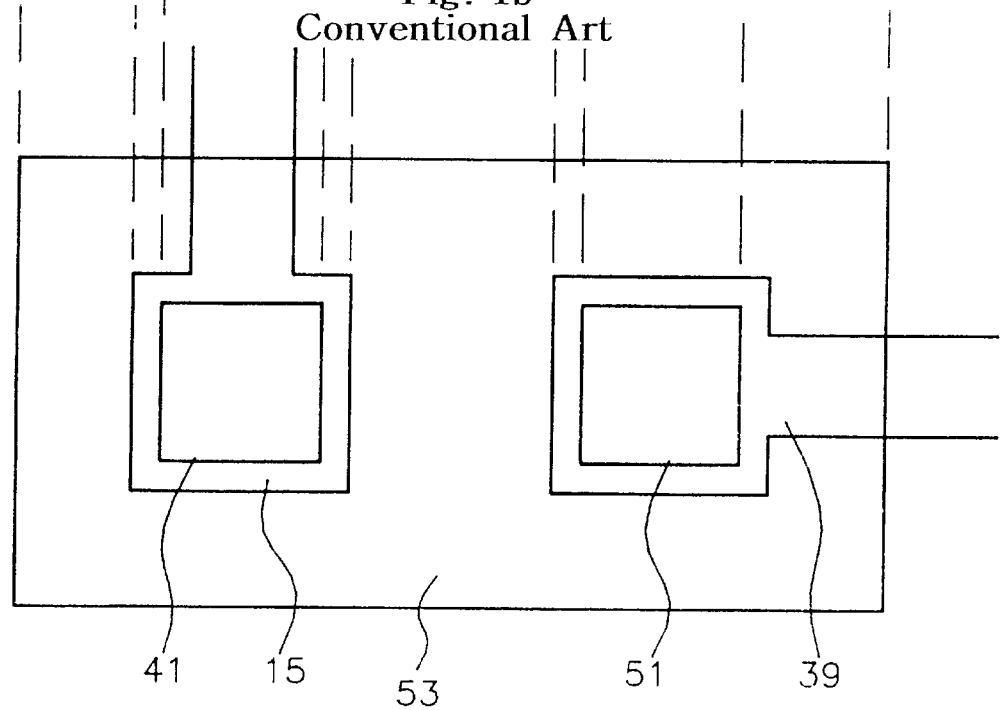
FIG. 1b shows a plan view of the conventional structure of connecting the two lines formed on separate layers.
Figure 2A:
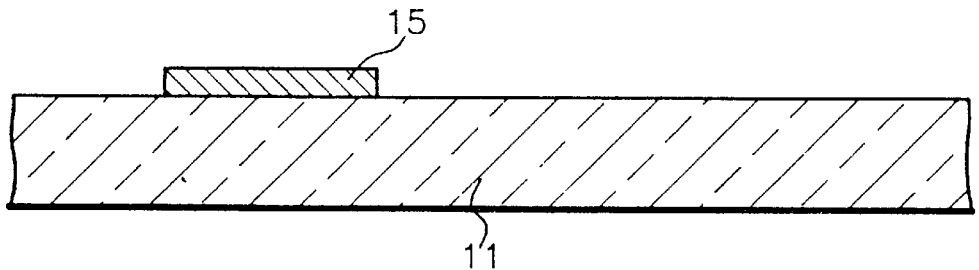
FIGS. 2a–2d are cross-sectional views showing the conventional manufacturing process of connecting two lines formed on separate layers.
Figure 2B:
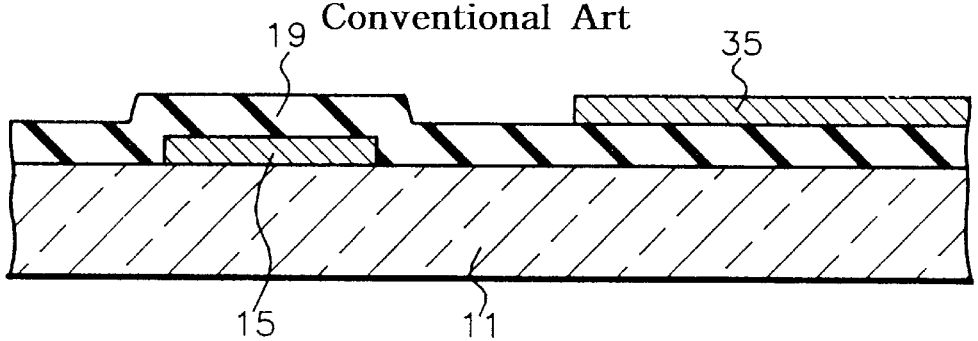
Figure 2C:
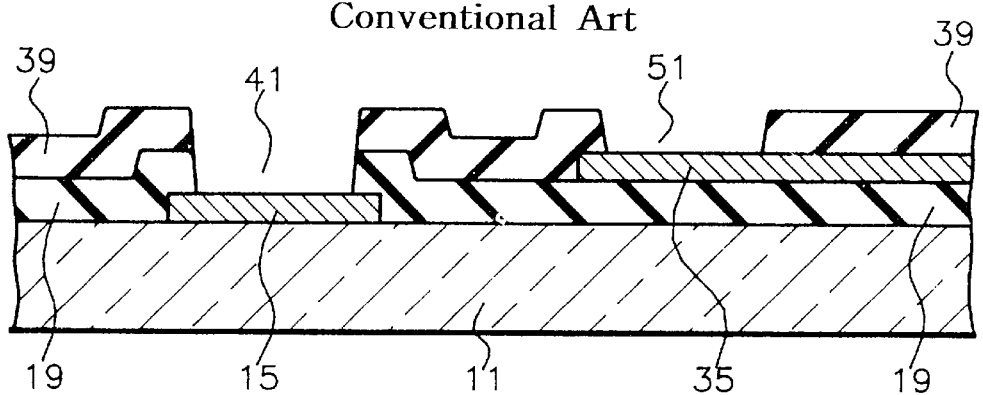
Figure 2D:
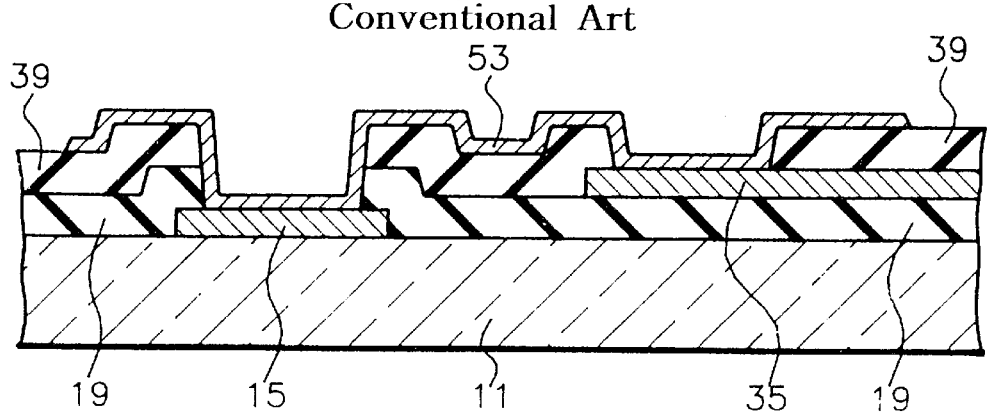
Figure 3A:
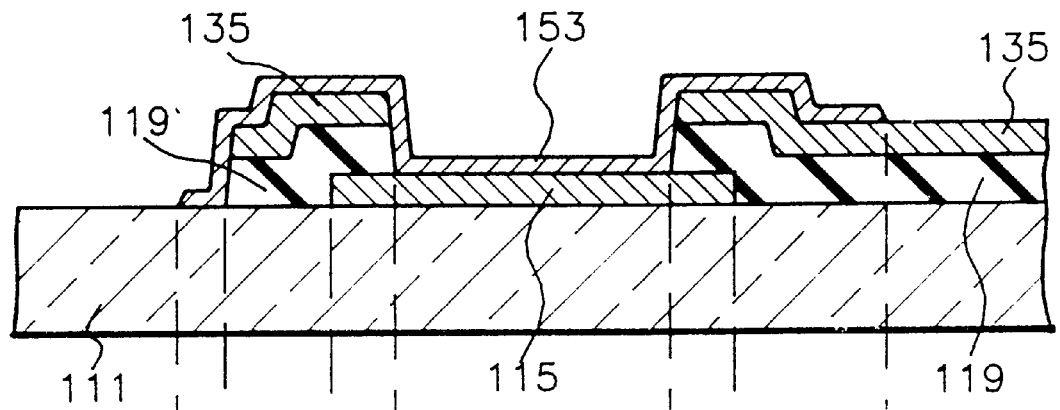
FIG. 3a shows a cross-sectional view of a first structure for connecting two lines formed on separate layers according to a first preferred embodiment of the present invention.
Figure 3B:
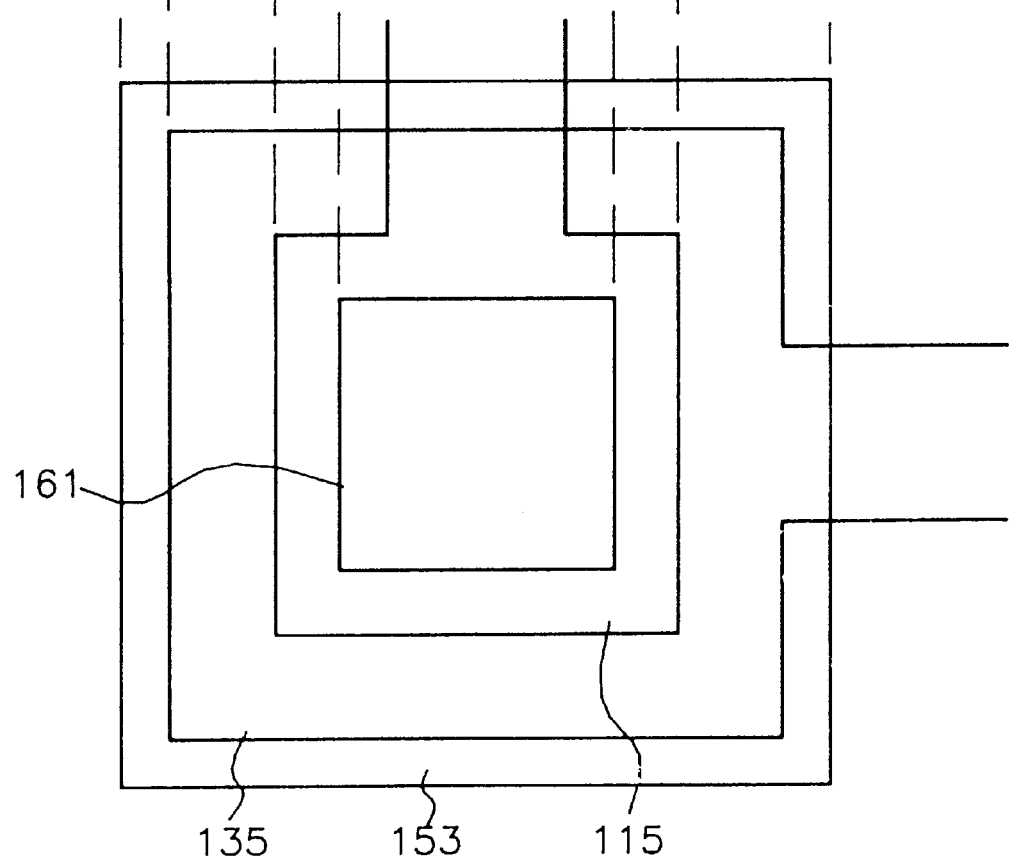
FIG. 3b shows a plan view of the structure of FIG. 3a for connecting two lines formed on separate layers.

Referring to FIGS. 3a–3b and 4a–4d, a first preferred embodiment of the present invention will be described. FIG. 3a shows a cross-sectional view of a wiring structure. FIG. 3b shows a plan view of FIG. 3a. FIGS. 4a–4d show the processing steps.

Figure 4A:
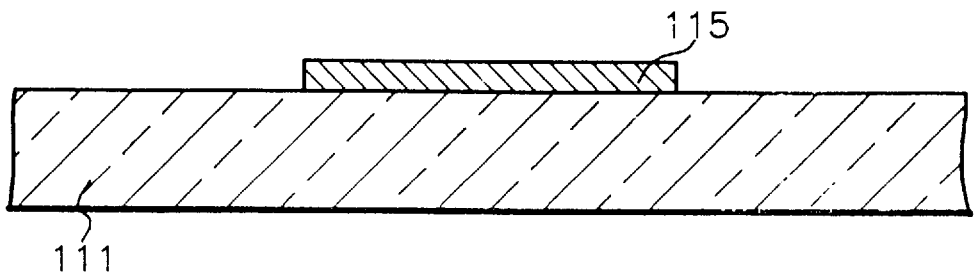
FIGS. 4a–4d are cross-sectional views showing a manufacturing process for the structure of FIG. 3a, FIG. 5a shows a cross-sectional view of a structure for connecting two lines formed on separate layers according to a second preferred embodiment of the present invention.

A metal layer, such as aluminum, is deposited on a substrate 111. The aluminum layer is patterned to form a gate line 115, as shown in FIG. 4a. The gate line 115 is connected to the gate electrodes (not shown) of TFTs arrayed in a row direction.

Figure 4B:
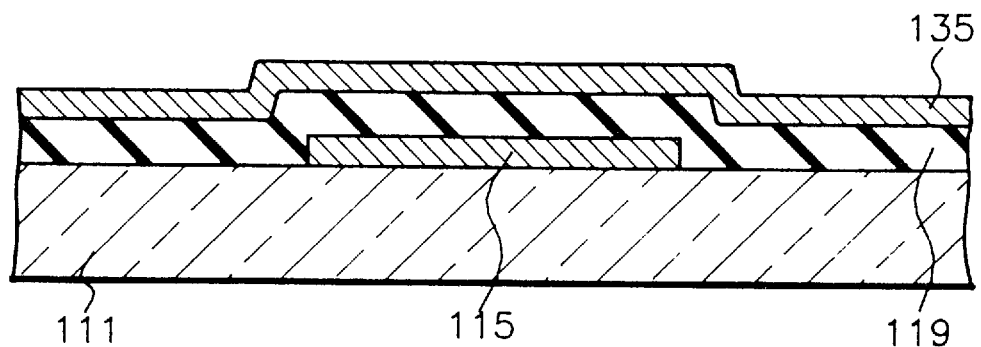

An insulation material, such as silicon oxide or silicon nitride, is deposited on the substrate 111 and the gate line 115 to form a gate insulation layer 119. A metal layer, such as chromium or chromium alloy, is deposited on the gate insulation layer 119 to form a chromium layer. The chromium layer is patterned to form a source line 135. The source line 135 is connected to the source electrodes (not shown) of the TFTs arrayed in a column direction. Here, the gate line 115 and the source line 135 overlap in part in order to be connected to each other in a later step, as shown in FIG. 4b.

Figure 4C:
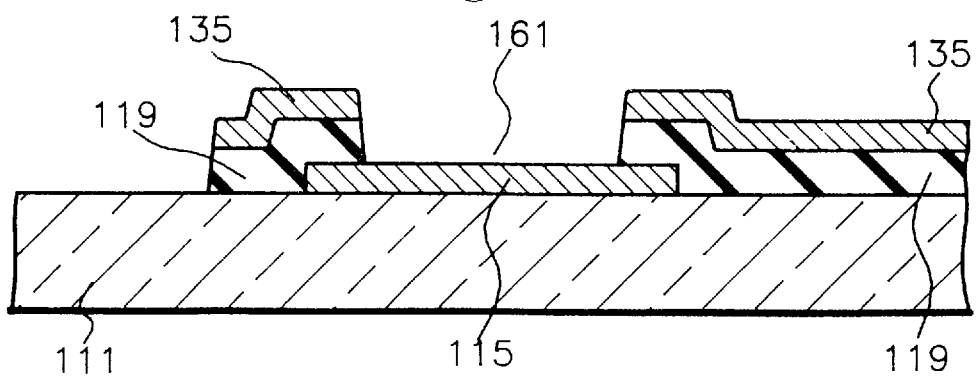

The overlapping part of the source line 135 over the gate line 115 is removed to form a top contact hole. A portion of the gate insulation layer 119 exposed through the top contact hole is also removed by etching, as shown in FIG. 4c. The contact hole 161, which exposes a portion of the gate line 115, may be formed in one etching step using the source line 135 as a mask.

Figure 4D:
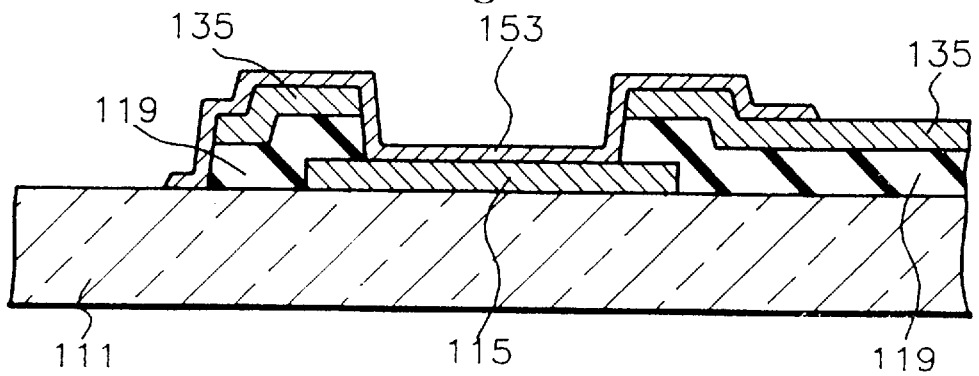

A conductive material, such as indium tin oxide (ITO), is deposited on the substrate 111 including the patterned source line 135. The conductive layer is patterned to form a connecting pad 153. The connecting pad 153 connects the exposed surface of the gate line 115 with the etched side and the surface of the source line 135 through the contact hole 161, as shown in FIG. 4d.

Second Preferred Embodiment

Figure 5A:
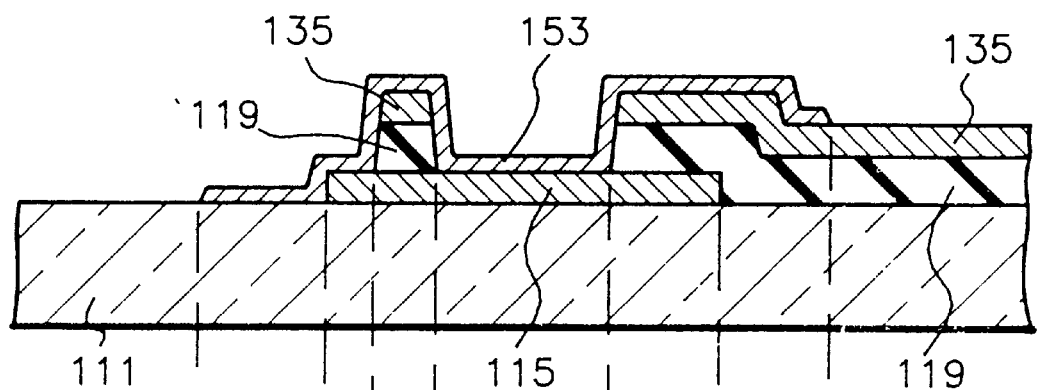
Figure 5B:
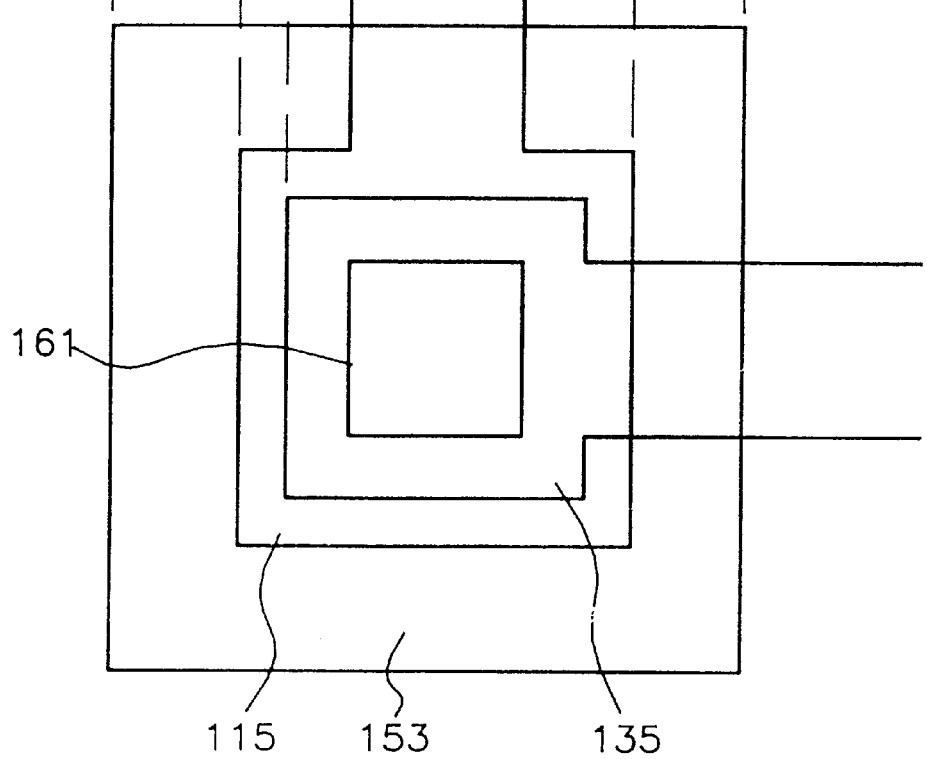

This embodiment is another example of the present invention with a different shape of the source line. Referring to FIGS. 5a–5b and 6a–6d, a second embodiment of the present invention will be described. FIG. 5a shows a cross-sectional view of the wiring structure. FIG. 5b shows a plan view of FIG. 5a. FIGS. 6a–6d show cross-sectional views of the processing steps.

Figure 6A:
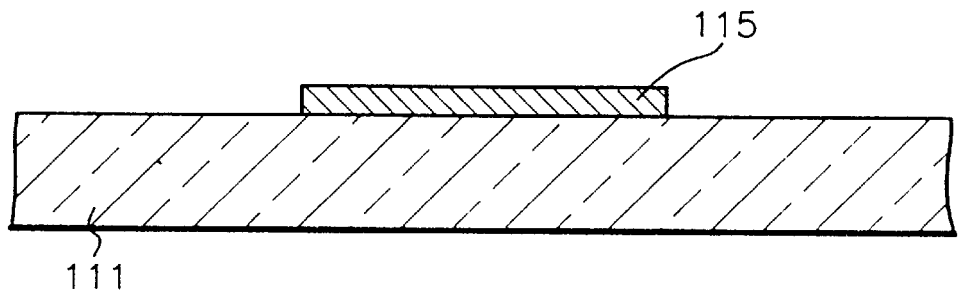

A metal layer, such as aluminum or an aluminum alloy, is deposited on a substrate 111 to form an aluminum layer. The aluminum layer is patterned to form a gate line 115, as shown in FIG. 6a. The gate line 115 is connected to the gate electrodes (not shown) of TFTs arrayed in a row direction.

Figure 6B:
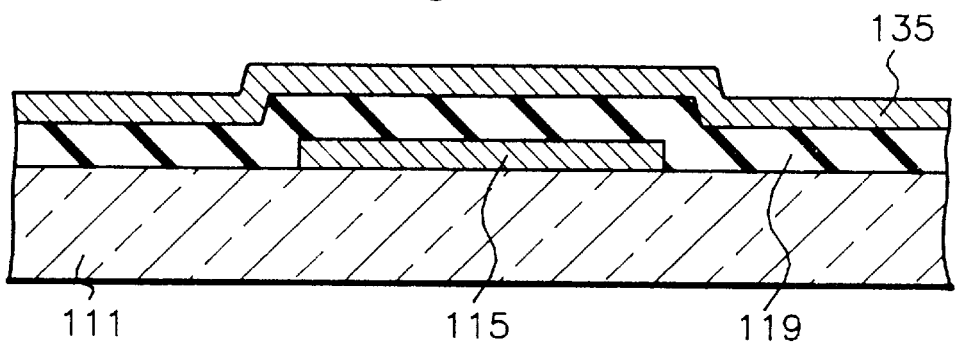

An insulation material, such as silicon oxide or silicon nitride, is deposited on the substrate 111 and the gate line 115 to form a gate insulation layer 119. A metal layer, such as chromium or a chromium alloy, is deposited on the gate insulation layer 119 to form a chromium layer. The chromium layer is patterned to form a source line 135. The source line 135 is connected to the source electrodes (not shown) of the TFTs arrayed in a column direction. Here, the gate line 115 and the source line 135 overlaps in part in order to be connected to each other in a later stage, as shown in FIG. 6b. The width of the source line 135 is narrower than that of the gate line 115 in the overlapping portion.

Figure 6C:
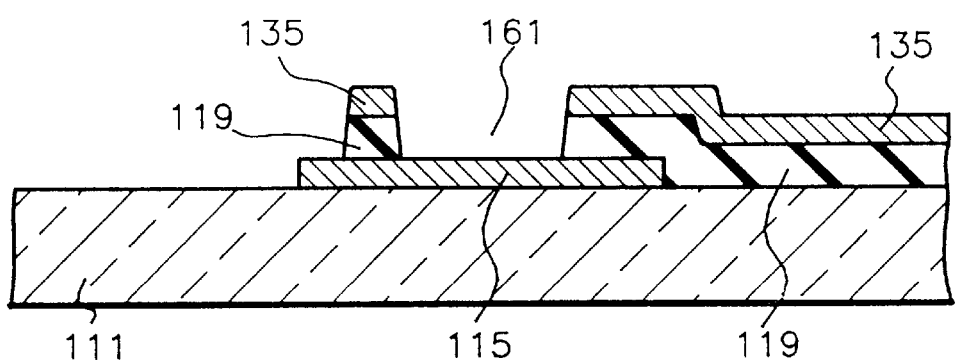
Figure 6D:
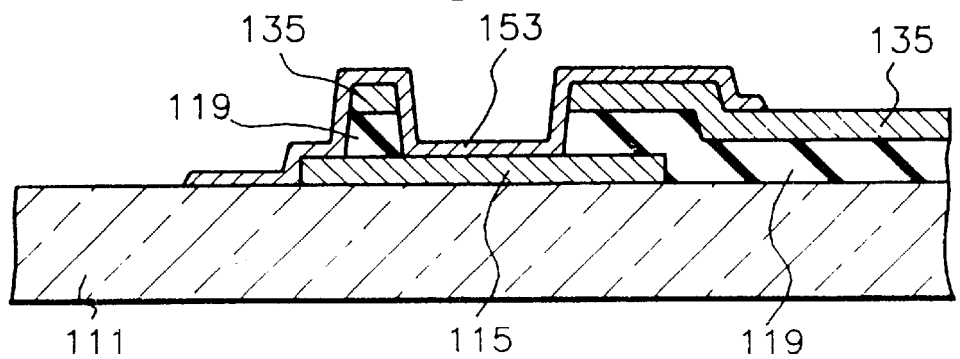

The overlapping portion of the source line 135 with the gate line 115 is partially removed to form a top contact hole. The gate insulation layer 119 is continuously etched using the source line 135 as a mask. Then a portion of the gate line 115 is exposed through a contact hole 161, as shown in FIG. 6c.

A conductive material, such as ITO, is deposited on the substrate 111 including the patterned source line 135. The conductive layer is patterned to form a connecting pad 153. The connecting pad 153 connects the exposed surface of the gate line 115 with the etched side and the surface of the source line 135 through the contact hole 161, as shown in FIG. 4d. Here, the exposed area of the gate line 115 may be made larger than that of the first preferred embodiment above. This means that the contact area of the source line 135 and the gate line 115 may be made larger than that of the first preferred embodiment.

Alternatively, the connecting pad 153 may be patterned to cover the entire gate line 115 and source line 135. In this case, the gate line 115 and the source line 135 will not be overetched by an etchant used in patterning the ITO layer.

Third Preferred Embodiment

Figure 7A:
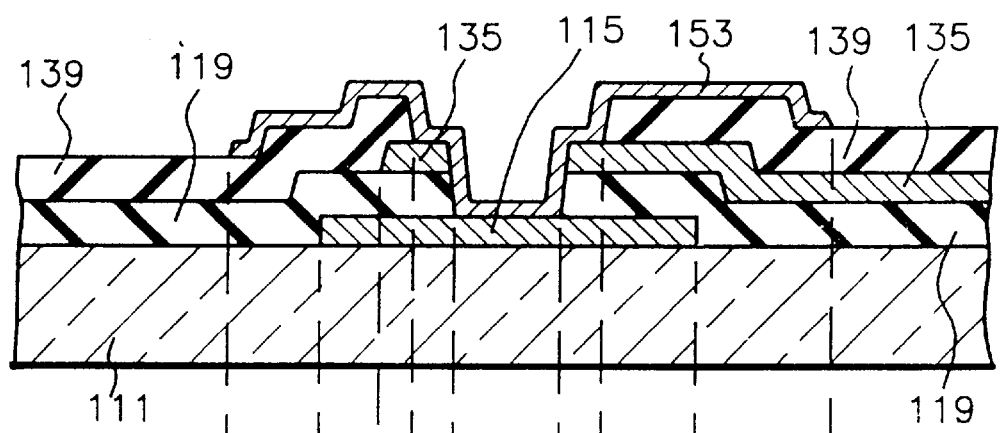
FIG. 7a shows a cross-sectional view of a structure for connecting two lines formed on separate layers according to a third preferred embodiment of the present invention.
Figure 7B:
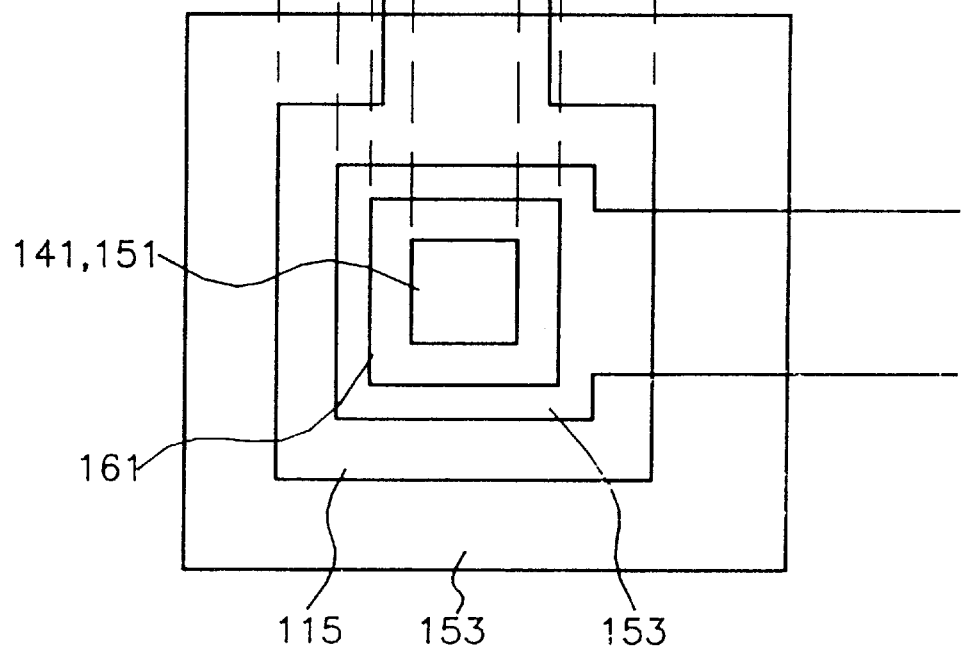

Referring to FIGS. 7a–7b and 8a–8d, a third preferred embodiment of the present invention will be described. FIG. 7a shows a cross-sectional view of still another wiring structure. FIG. 7b showing a plan view of FIG. 7a. FIGS. 8a–8d show cross-sectional views of processing steps.

Figure 8A:
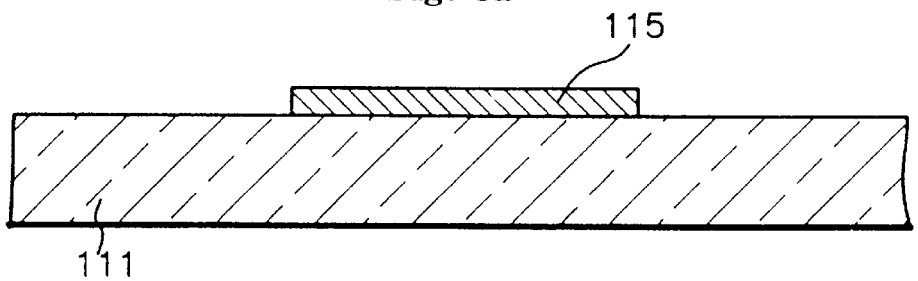
FIGS. 8a–8d are cross-sectional views showing a third manufacturing process for connecting two lines formed on separate layers.

A metal layer, such as aluminum or an aluminum alloy, is deposited on a substrate 111 to form an aluminum layer. The aluminum layer is patterned to form a gate line 115, as shown in FIG. 8a. The gate line 115 is connected to the gate electrodes (not shown) of TFTs arrayed in a row direction.

Figure 8B:
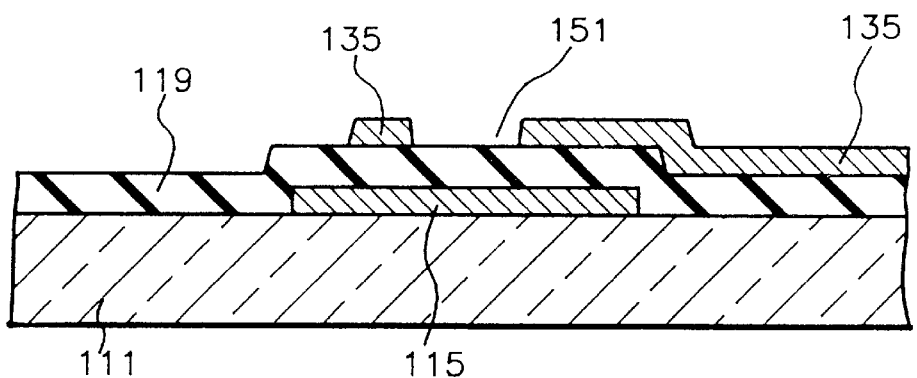

An insulation material, such as silicon oxide or silicon nitride, is deposited on the substrate 111 and the gate line 115 to form a gate insulation layer 119, A metal layer, such as chromium or a chromium alloy, is deposited on the gate insulation layer 119 to form a chromium layer. The chromium layer is patterned to form a source line 135. The source line 135 is connected to the source electrodes (not shown) of TFTs arrayed in a column direction. Here, the gate line 115 and the source line 135 overlap in order to be connected to each other in a later stage. The overlapping portion of the source line 135 is patterned to form a source contact hole 151, as shown in FIG. 8b.

Figure 8C:
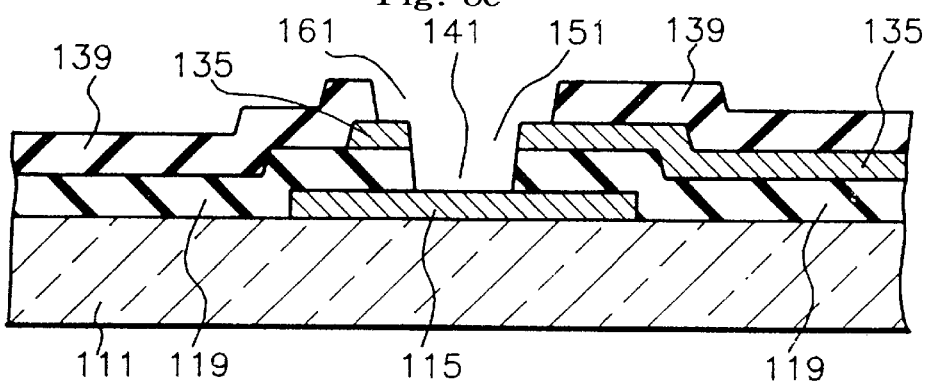

An insulation material, such as silicon nitride or silicon oxide, is deposited to form a protection layer 139. A portion of the protection layer 139 covering the overlapping portion of the gate line 115 and the source line 135 is then removed by a photolithographic method to form a top contact hole 161'. After that, the exposed portion of the gate insulation layer 119 is etched through the top contact hole 161' to form a gate contact hole 141, which has the same shape as the source contact hole 151. Here, if the size of the top contact hole 161' in the protection layer 139 is larger than the size of the source contact hole 151, the source line 135 is exposed not only on the etched side but also on a portion of the surface of the source line 135. Therefore, the contacting area is larger, as shown in FIG. 8c.

Figure 8D:
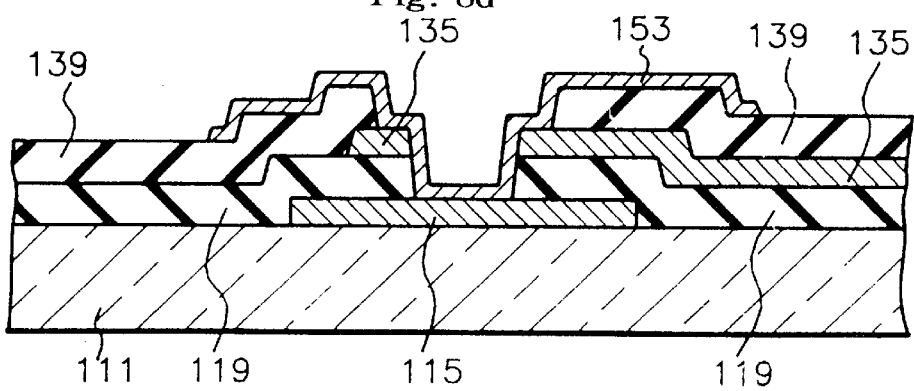

A conductive material, such as ITO, is deposited on the protection layer 139. The ITO layer is patterned to form a connecting pad 153 connecting to the gate line 115 with the source line 135. The gate contact hole 141, the source contact hole 151, and the top contact hole 161'. The connecting pad 153 is also connected to the surface and the etched side of the source line 135 exposed through the source contact hole 151 and the top contact hole 161', as shown in FIG. 8d.

In this embodiment, the gate contact hole 141, the source contact hole 151, and the top contact hole 161' are formed as a vertical array at the same location. Therefore, the total area used for the contact holes can be made smaller than in the conventional art.

Fourth Preferred Embodiment

Referring to FIGS. 9a–9e showing the cross-sectional views of processing steps, a fourth preferred embodiment of the present invention will be described. In this embodiment, the gate line has two metal layers and the structure of the contact holes is the same as that in the third preferred embodiment. The structure of this embodiment can easily be applied to the first and second embodiments above.

Figure 9A:
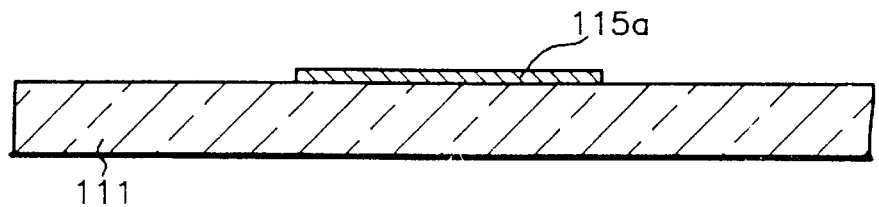
FIGS. 9a–9e are cross-sectional views showing a manufacturing process for connecting two lines formed on separate layers according to a fourth preferred embodiment of the present invention.

A first metal layer, including aluminum or an aluminum alloy, is deposited on a substrate 111 to form an aluminum layer. The aluminum layer is patterned to form a low resistance gate line 115a, as shown in FIG. 9a.

Figure 9B:
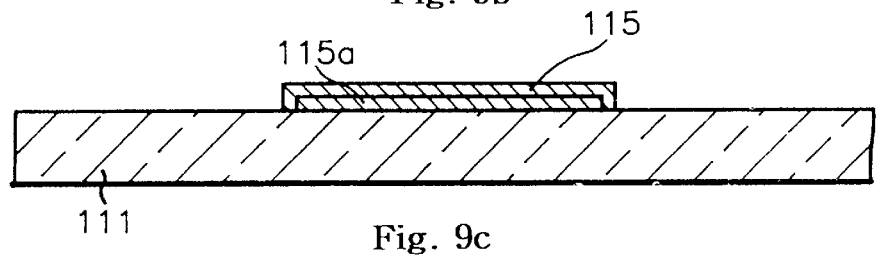

A second metal layer, such as molybdenum, tantalum, or antimony, is deposited on the substrate 111 including the low resistance gate line 115a. The second metal layer is patterned to form a second-metal gate line 115. The second-metal gate line 115 covers the low resistance gate line 115a, as shown in FIG. 9b. Because the low resistance gate line 115a includes aluminum, a hillock may grow on the surface of the low resistance gate line 115a without preventive means. The second-metal gate line 115 prevents the hillock from growing.

Figure 9C:
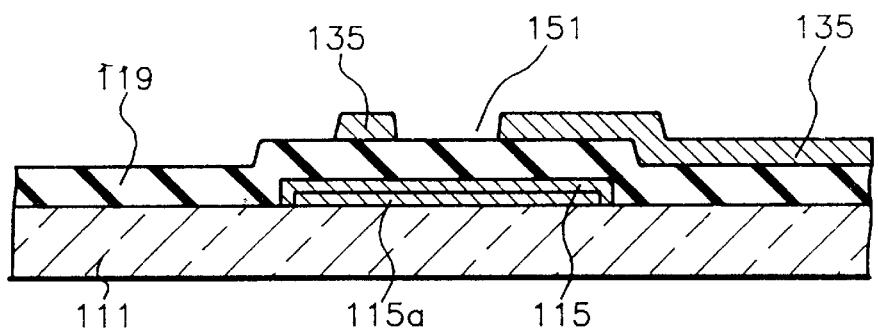
Figure 9D:
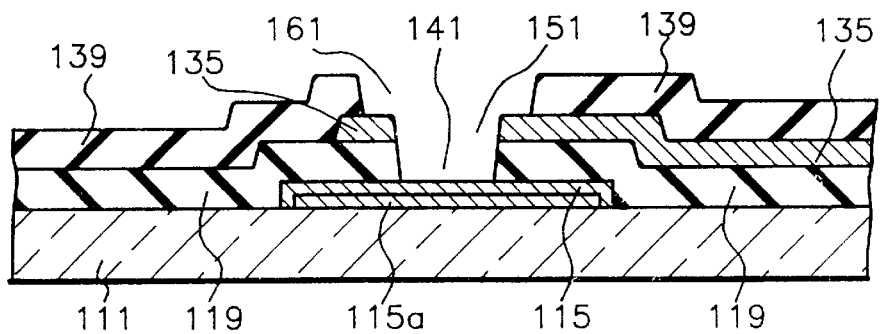

An insulation material, such as silicon oxide or silicon nitride, is deposited on the substrate 111 including the second-metal gate line 115 to form a gate insulation layer 119. A metal layer, such as chromium or chromium alloy, is deposited on the gate insulation layer 119 to form a chromium layer. The chromium layer is patterned to form a source line 135. The source line 135 is connected to the source electrodes (not shown) of TFTs arrayed in a column direction. Here, the second-metal gate line 115 and the source line 135 partly overlap with each other to be connected in a later stage. The overlapping portion of the source line 135 is patterned to form a source contact hole 151, as shown in FIG. 9c.

An insulation material, such as silicon nitride or silicon oxide, is used to form a protection layer 139. A portion of the protection layer 139 covering the overlapping portion of the second-metal gate line 115 and the source line 135 is removed by a photolithographic method to form a top contact hole 161'. After that, the portion of the exposed gate insulation layer 119 exposed through the top contact hole 161' is etched to form a gate contact hole 141 having the same shape as the source contact hole 151. Here, if the size of the top contact hole 161' in the protection layer 139 is larger than that of the source contact hole 151, the source line 135 is exposed not only on the etched side but also on a portion of the surface of the source line 135. Therefore, the contact area can be made larger, as shown FIG. 9d.

Figure 9E:
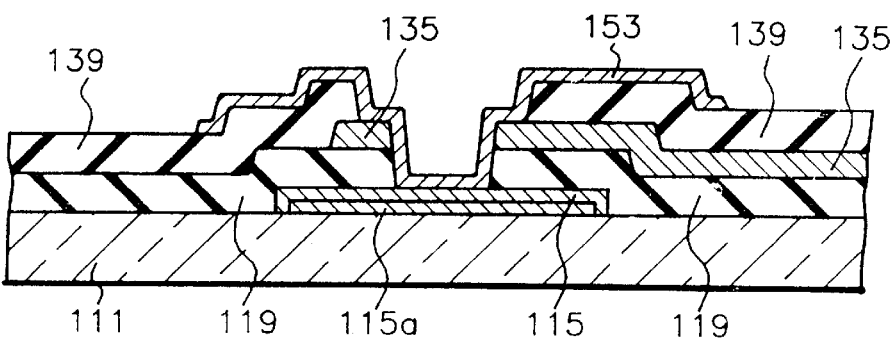

A conductive material, such as ITO, is deposited on the protection layer 139. The ITO layer is patterned to form a connecting pad 153 connecting to the second-metal gate line 115 with the source line 135 through the gate contact hole 141, the source contact hole 151', and the top contact hole 161. The surface and the etched side of the source line 135, which are exposed through the source contact hole 151 and the top contact hole 161, also contribute to the connection, as shown in FIG. 9e.

Fifth Preferred Embodiment

Referring to FIGS. 10a–10e showing the cross-sectional views of processing steps, a fifth preferred embodiment of the present invention will be described. In this embodiment, the gate line has two metal layers and the structure of the contact holes is the same as that in the third preferred embodiment. The method of this embodiment can easily be applied to the first and second embodiments above.

Figure 10A:
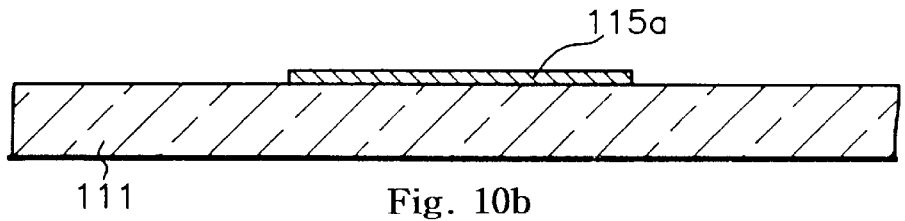
FIGS. 10a–10e are cross-sectional views showing a manufacturing process for connecting two lines formed on separate layers according to a fifth preferred embodiment of the present invention.

A metal layer including aluminum is deposited on a substrate 111 to form an aluminum layer. The aluminum layer is patterned to form a low resistance gate line 115a, as shown in FIG. 10a.

Figure 10B:
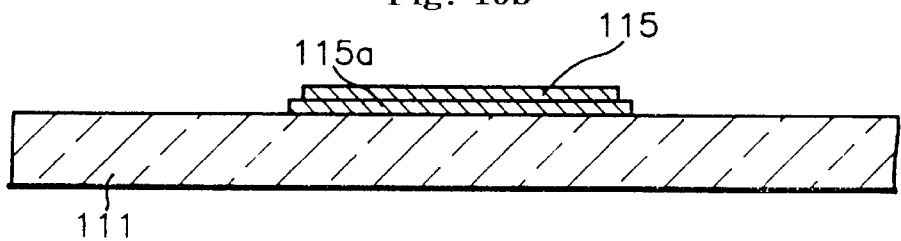

A metal layer, such as molybdenum, tantalum, or antimony, is deposited on the substrate 111 including the low resistance gate line 115a. The metal layer is patterned to form a second-metal gate line 115. The second-metal gate line 115 is located on the low resistance gate line 115a, as shown in FIG. 10b. Because the low resistance gate line 115a includes aluminum, a hillock may grow on a surface of the low resistance gate line 115a without preventive measures. The second-metal gate line 115 prevents the hillock from growing. Here, the second-metal gate line 115 does not cover entire low resistance gate line 115a, but covers only a portion of it, so the hillock will not grow on the covered surface of the low resistance gate line 115a.

Figure 10C:
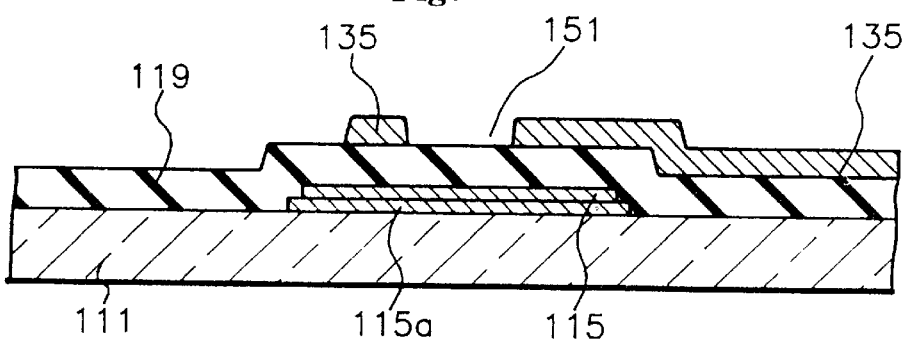

An insulation material, such as silicon oxide or silicon nitride, is deposited on the substrate 111 including the second-metal gate line 115 to form a gate insulation layer 119. A metal layer including a metal, such as chromium or a chromium alloy, is deposited on the gate insulation layer 119 to form a chromium layer. The chromium layer is patterned to form a source line 135. The source line 135 is connected to the source electrodes (not shown) of TFTs arrayed in a column direction. Here, the second-metal gate line 115 and the source line 135 overlap in part in order to be connected to each other at a later stage. The overlapping portion of the source line 135 is patterned to form a source contact hole 151, as shown in FIG. 10c.

Figure 10D:
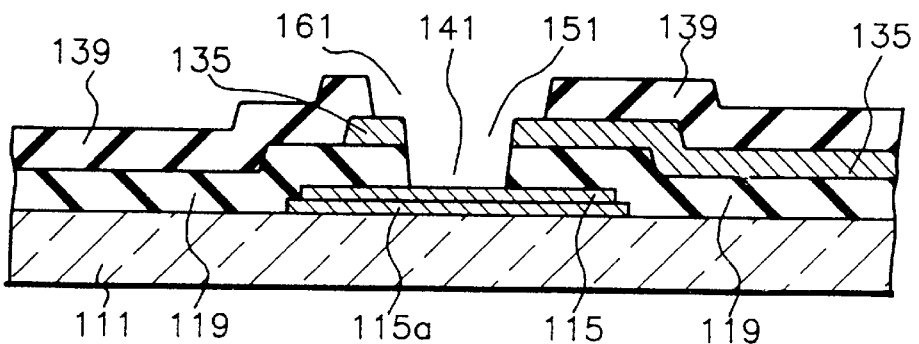

An insulation material, such as silicon nitride or silicon oxide, is deposited to form a protection layer 139. A portion of the protection layer 139 covering the overlapping portion of the second-metal gate line 115 and the source line 135 is removed by a photolithographic method to form a top contact hole 161'. After that, the portion of the gate insulation layer 119 exposed through the top contact hole 161' is etched to form a gate contact hole 141 having the same shape as the source contact hole 151. Here, if the size of the top contact hole 161' in the protection layer 139 is larger than that of the source contact hole 151, the source line 135 is exposed not only on the etched side but also on a portion of the surface of the source line 135. Therefore, the contact area can be made larger, as shown in FIG. 10d.

Figure 10E:
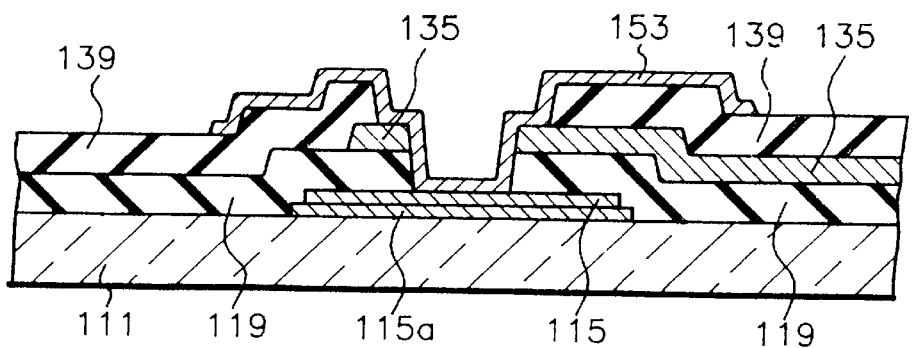

A conductive material, such as ITO, is deposited on the protection layer 139. The ITO layer is patterned to form a connecting pad 153 connecting to the second-metal gate line 115 with the source line 135 through the gate contact hole 141, the source contact hole 151, and the top contact hole 161'. The surface and the etched side of the source line 135, which are exposed through the source contact hole 151 and the top contact hole 161 also contribute to the connection, as shown in FIG. 10e.

While the invention has been described in detail and with reference to specific embodiments thereof, it will be apparent to those skilled in the art that various changes and modifications can be made therein without departing from the spirit and scope thereof. Thus, it is intended that the present invention cover the modifications and variations of this invention provided they come within the scope of the appended claims and their equivalents.

What is claimed is:

1. A semiconductor device comprising:

a substrate;

a first conductive layer on the substrate;

an insulation layer covering the first conductive layer and having a first contact hole exposing a portion of the first conductive layer;

a second conductive layer having an overlapping portion overlapping the first conductive layer, the overlapping portion having a second contact hole exposing the portion of the first conductive layer that is exposed through the first contact hole; and a conductive pad on a top surface of the second conductive layer, the conductive pad connecting the first conductive layer with the second conductive layer through the first and the second contact holes.

2. The semiconductor device according to claim 1, wherein the first conductive layer includes aluminum.

3. The semiconductor device according to claim 1, wherein the second conductive layer includes chromium.

4. The semiconductor device according to claim 1, wherein the conductive pad includes indium tin oxide.

5. The semiconductor device according to claim 1, wherein the conductive pad is in contact with a side of the second conductive layer.

6. The semiconductor device according to claim 1, wherein the first conductive layer includes a first metal layer and a second metal layer.

7. The semiconductor device according to claim 6, wherein the first metal layer includes aluminum.

8. The semiconductor device according to claim 6, wherein the second metal layer includes at least one of molybdenum, tantalum, and antimony.

9. A semiconductor device comprising:

a substrate;

a first conductive layer on the substrate;

a first insulation layer covering the first conductive layer and having a first contact hole exposing a portion of the first conductive layer;

a second conductive layer having an overlapping portion overlapping the first conductive layer, the overlapping portion having a second contact hole exposing the exposed portion of the first conductive layer;

a second insulation layer covering the second conductive layer and the first insulation layer, the second insulation layer having a third contact hole exposing the exposed portion of the first conductive layer; and a conductive pad over the second insulation layer and in contact with a top surface of the second conductive layer, the conductive pad connecting the first conductive layer with the second conductive layer through the first, second, and third contact holes.

10. The semiconductor device according to claim 9, wherein the first conductive layer includes aluminum.

11. The semiconductor device according to claim 9, wherein the second conductive layer includes chromium.

12. The semiconductor device according to claim 9, wherein the conductive pad includes indium tin oxide.

13. The semiconductor device according to claim 9, wherein the conductive pad is in contact with a side of the second conductive layer.

14. The semiconductor device according to claim 9, wherein the first conductive layer includes a first metal layer and a second metal layer.

15. The semiconductor device according to claim 14, wherein the first metal layer includes aluminum.

16. The semiconductor device according to claim 14, wherein the second metal layer includes at least one of molybdenum, tantalum, and antimony.

17. The semiconductor device according to claim 1, wherein the substrate is transparent.

18. The semiconductor device according to claim 1, wherein the first conductive layer is formed directly on the substrate.

19. The semiconductor device according to claim 1, wherein the conductive pad is in contact with a top surface of the first conductive layer.

20. The semiconductor device according to claim 19, wherein the substrate is transparent.

21. The semiconductor device according to claim 20, wherein the first conductive layer is formed directly on the substrate.

22. The semiconductor device according to claim 21, wherein the first conductive layer includes a first metal layer and a second metal layer, the second metal layer being formed of a different metal from the first metal layer.

23. A semiconductor device comprising:

a transparent substrate;

a first conductive layer directly on the transparent substrate;

an insulation layer covering the first conductive layer and having a first contact hole exposing a portion of the first conductive layer;

a second conductive layer having an overlapping portion overlapping the first conductive layer, the overlapping portion having a second contact hole exposing the portion of the first conductive layer that is exposed through the first contact hole; and a conductive pad on the second conductive layer, the conductive pad connecting the first conductive layer with the second conductive layer through the first and the second contact holes.

24. The semiconductor device according to claim 17, wherein the first conductive layer includes aluminum.

25. The semiconductor device according to claim 17, wherein the second conductive layer includes chromium.

26. The semiconductor device according to claim 17, wherein the conductive pad includes indium tin oxide.

27. The semiconductor device according to claim 17, wherein the conductive pad is in contact with a side of the second conductive layer.

28. The semiconductor device according to claim 17, wherein the first conductive layer includes a first metal layer and a dissimilar second metal layer.

29. The semiconductor device according to claim 28, wherein the first metal layer includes aluminum.

30. The semiconductor device according to claim 28, wherein the second metal layer includes at least one of molybdenum, tantalum, and antimony.

31. The semiconductor device according to claim 17, wherein the conductive pad is in contact with a top surface of the first conductive layer.

32. A semiconductor device comprising:

a transparent substrate;

a first conductive layer on the transparent substrate;

a first insulating layer covering the first conductive layer and having a first contact hole exposing a portion of the first conductive layer;

a second conductive layer having an overlapping portion overlapping the first conductive layer, the overlapping portion having a second contact hole exposing the portion of the first conductive layer exposed by the first contact hole;

a second insulating layer covering the second conductive layer and having a third contact hole exposing a portion of the first conductive layer; and a connecting layer over the second conductive layer and second insulating layer, the connecting layer connecting the first conductive layer with the second conductive layer through the first and second contact holes.

33. A semiconductor according to claim 32, wherein a width of the third contact hole is wider than a width of the first contact hole.

34. A semiconductor according to claim 32, wherein the third contact hole of the second insulating layer exposes the second conductive layer.

* * * * *